US012765369B2

(12) United States Patent
Chen et al.

(10) Patent No.: US 12,765,369 B2
(45) Date of Patent: Oct. 13, 2026

(54) METHOD OF FORMING SEMICONDUCTOR PACKAGE

(71) Applicant: Taiwan Semiconductor Manufacturing Company, Ltd., Hsinchu (TW)

(72) Inventors: Jie Chen, New Taipei City (TW); Hsien-Wei Chen, Hsinchu City (TW); Ming-Fa Chen, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 38 days.

(21) Appl. No.: 18/751,362

(22) Filed: Jun. 24, 2024

(65) Prior Publication Data

US 2024/0347447 A1 Oct. 17, 2024

Related U.S. Application Data

(60) Continuation of application No. 17/857,043, filed on Jul. 4, 2022, now Pat. No. 12,062,608, which is a division of application No. 16/876,111, filed on May 17, 2020, now Pat. No. 11,854,967.

(60) Provisional application No. 62/893,784, filed on Aug. 29, 2019.

(51) Int. Cl.

| | |
|---|---|
| ***H10W 20/40*** | (2026.01) |
| ***H10W 20/42*** | (2026.01) |
| ***H10W 72/90*** | (2026.01) |
| ***H10W 74/10*** | (2026.01) |
| ***H10W 90/00*** | (2026.01) |

(52) U.S. Cl.

CPC ......... *H10W 20/497* (2026.01); *H10W 20/42* (2026.01); *H10W 72/90* (2026.01); *H10W 74/131* (2026.01); *H10W 90/00* (2026.01)

(58) Field of Classification Search

CPC ............. H01L 25/0657; H01L 25/0652; H01L 25/043; H01L 25/071; H01L 25/074; H01L 25/0756; H01L 25/112; H01L 25/117; H01L 2224/08145; H01L 27/0688; H01L 23/5227; H01L 23/645; H01F 17/0006–17/0033; H01F 2017/002; H01F 2017/004–0086; H01F 2017/046; H01F 2017/065; H01F 41/041–042; H01F 41/046

See application file for complete search history.

(56) References Cited

U.S. PATENT DOCUMENTS

2009/0218701 A1* 9/2009 Rofougaran ........... H04B 5/266 257/E23.114
2010/0289126 A1* 11/2010 Pagaila ............... H10W 70/614 257/659
2011/0006443 A1* 1/2011 Noguchi ............. H10W 44/501 257/786

(Continued)

*Primary Examiner* — Wael M Fahmy
*Assistant Examiner* — Quinton A Brasfield
(74) *Attorney, Agent, or Firm* — JCIPRNET

(57) ABSTRACT

A method of forming a semiconductor package includes the following steps. A first die is provided, wherein the first die comprises a plurality of first conductive patterns. A plurality of second conductive patterns are formed over the first die, wherein the second conductive patterns are connected to the first conductive patterns to form a first coil and a second coil surrounding the first coil.

20 Claims, 10 Drawing Sheets

(56) References Cited

U.S. PATENT DOCUMENTS

| | | | | |
|---|---|---|---|---|
| 2016/0133614 | A1* | 5/2016 | Gu | H10W 90/00 257/773 |
| 2016/0141244 | A1* | 5/2016 | Song | H10W 20/497 257/528 |
| 2017/0221819 | A1* | 8/2017 | Chu | H10W 20/497 |
| 2017/0373025 | A1* | 12/2017 | Kim | H10W 44/501 |
| 2018/0190637 | A1* | 7/2018 | Kitazume | H10W 90/00 |
| 2018/0315706 | A1* | 11/2018 | Liao | H10W 20/497 |
| 2019/0122931 | A1* | 4/2019 | Huang | H01F 17/0013 |
| 2019/0131277 | A1* | 5/2019 | Yang | H10P 74/273 |
| 2019/0148342 | A1* | 5/2019 | Hu | H10W 42/20 257/659 |
| 2020/0098621 | A1* | 3/2020 | Bharath | H10W 20/093 |
| 2020/0295121 | A1* | 9/2020 | Liao | H01L 21/4857 |
| 2021/0050303 | A1* | 2/2021 | Chien | H10W 20/497 |

* cited by examiner

METHOD OF FORMING SEMICONDUCTOR PACKAGE

CROSS-REFERENCE TO RELATED APPLICATION

The application is a continuation application of and claims the priority benefit of U.S. application Ser. No. 17/857,043, filed on Jul. 4, 2022, which is a divisional application of and claims the priority benefit of U.S. application Ser. No. 16/876,111, filed on May 17, 2020, which claims the priority benefit of U.S. provisional application Ser. No. 62/893,784, filed on Aug. 29, 2019. The entirety of the above-mentioned patent applications is hereby incorporated by reference herein and made a part of this specification.

BACKGROUND

The packages of integrated circuits are becoming increasing complex, with more device dies packaged in the same package to achieve more functions. For example, a package structure has been developed to include a plurality of device dies such as processors and memory cubes in the same package. The package structure can include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
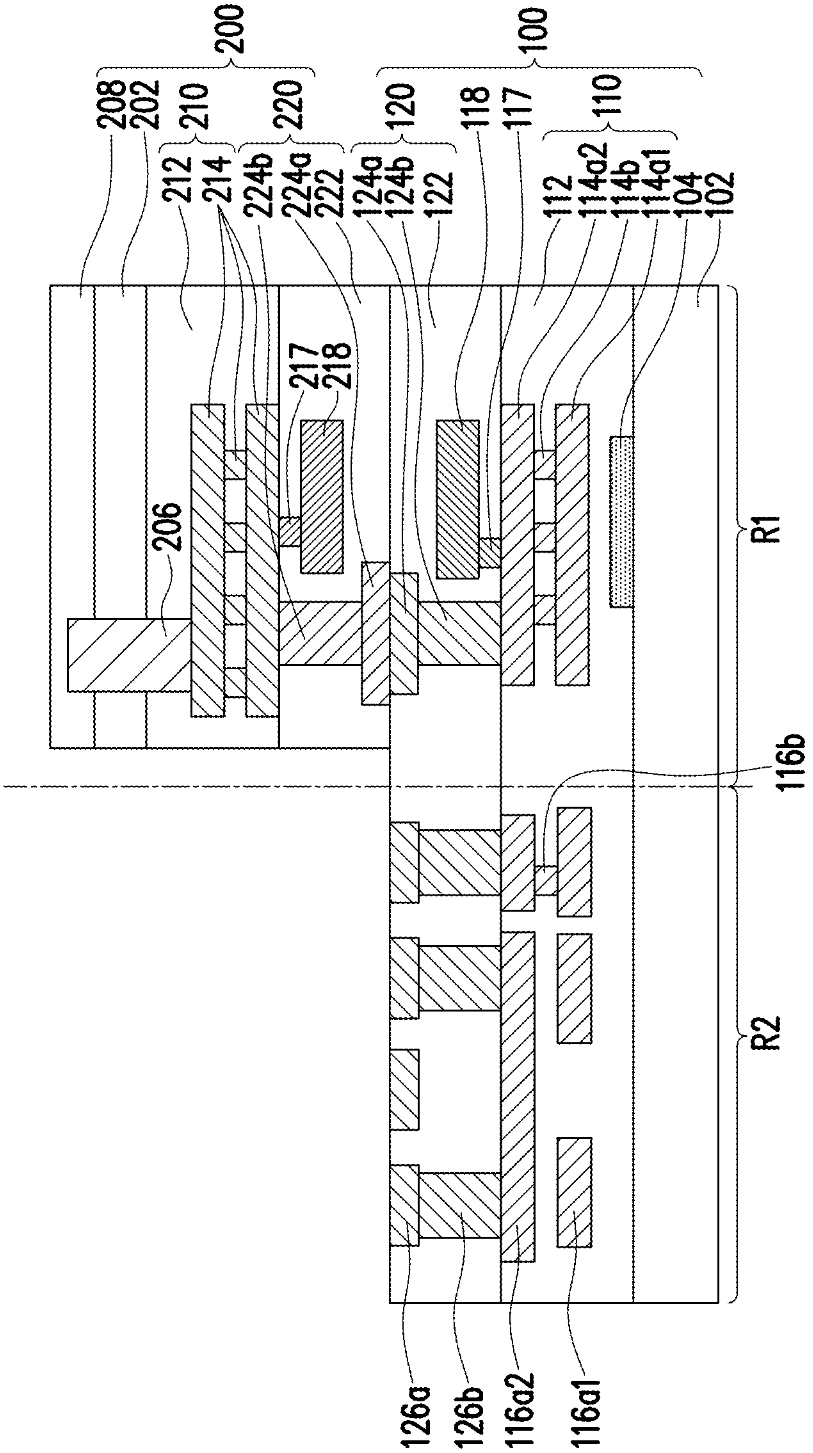
FIGS. 1A to 1D illustrate cross-sectional views of a method of forming a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as “first,” “second,” “third,” “fourth,” and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A to 1D illustrate cross-sectional views of a method of forming a semiconductor package in accordance with some embodiments. FIG. 2 is a three-dimensional view of the semiconductor package of FIG. 1D. For simplicity and clarity of illustration, some elements are omitted in FIG. 2.

Figure 1D:
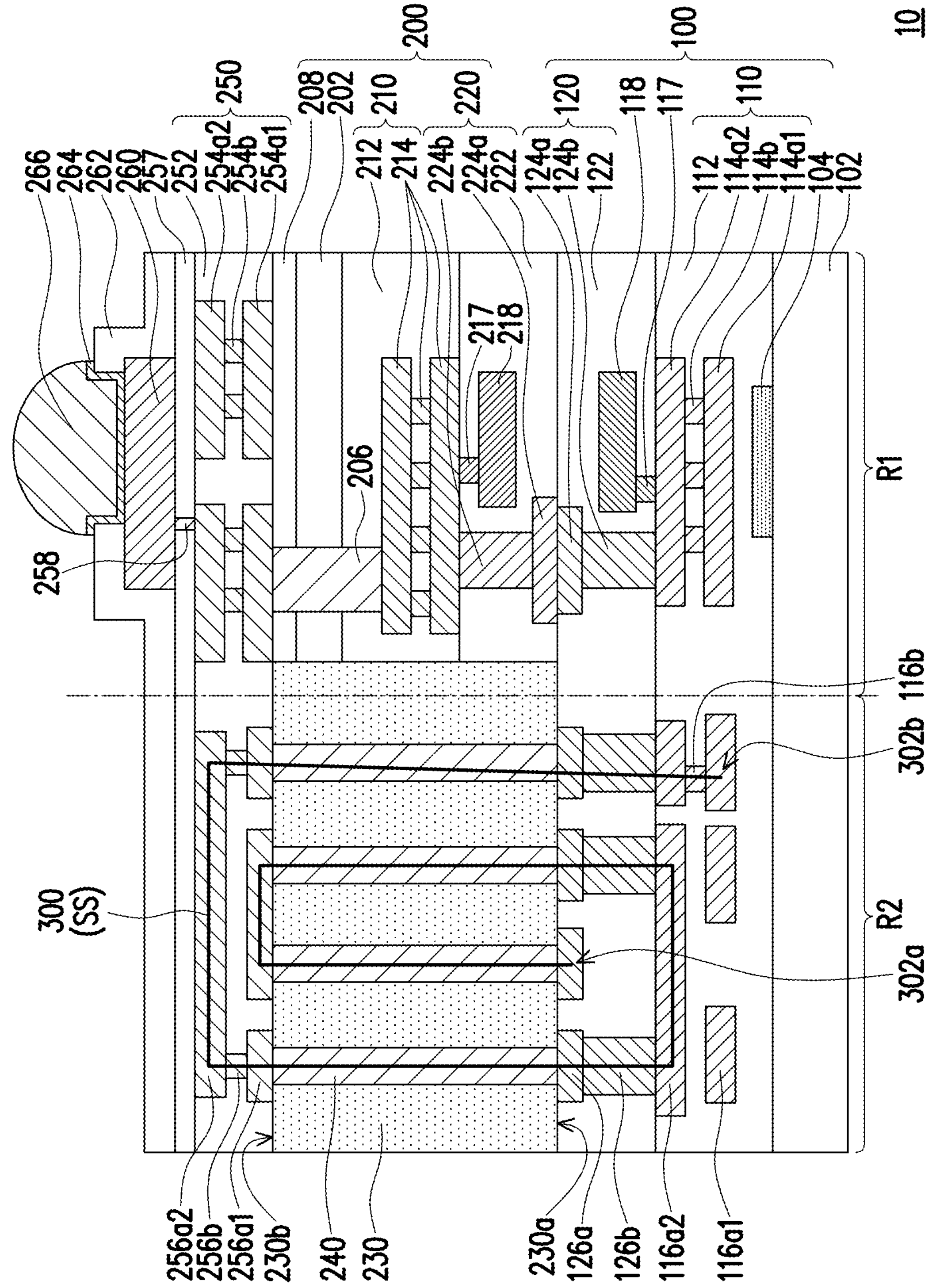
Figure 2:
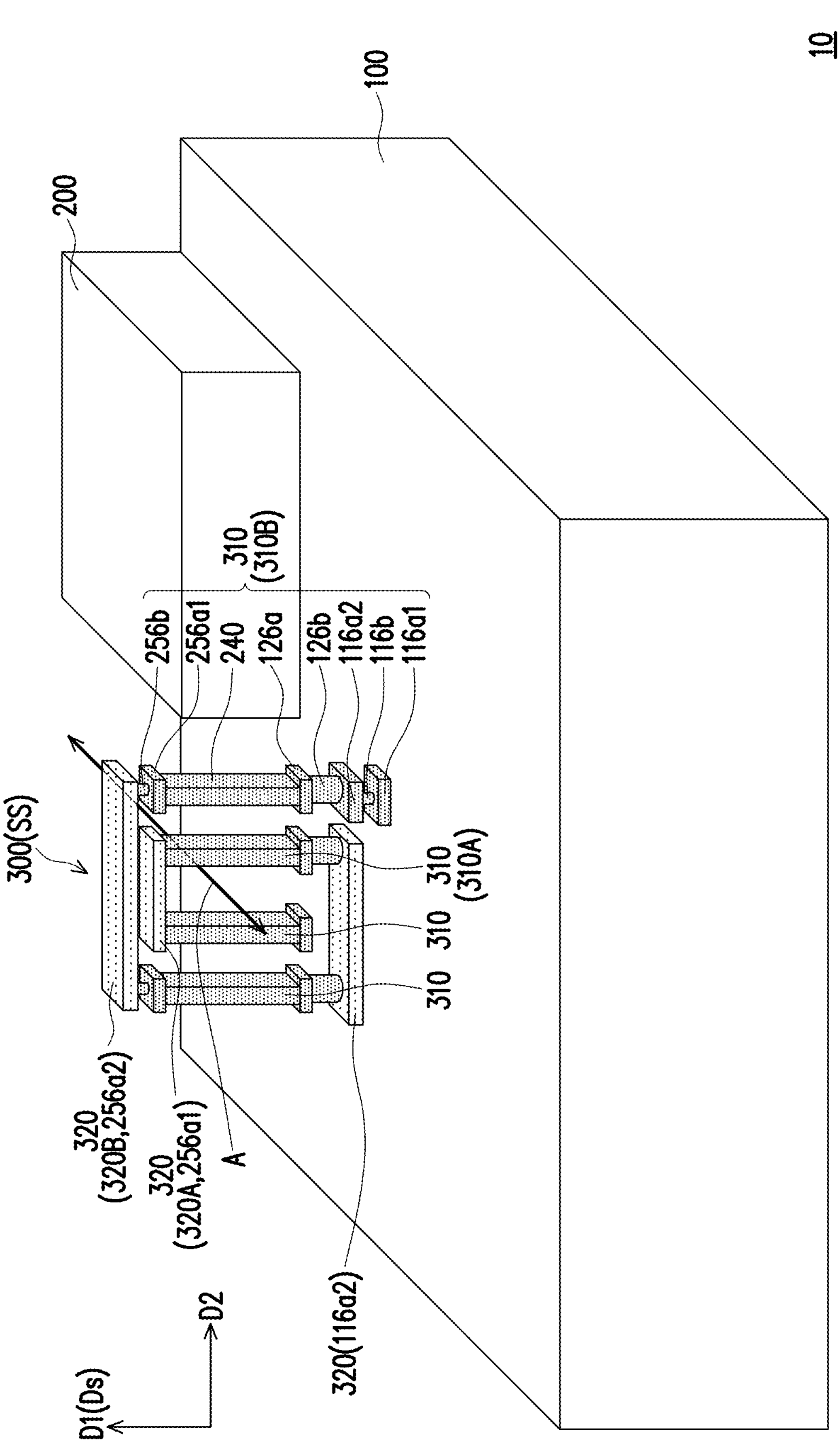
FIG. 2 is a three-dimensional view of the semiconductor package of FIG. 1D.

Referring to FIG. 1A, an integrated circuit 100 is provided. The integrated circuit 100 may be a wafer or a die. The die may be an application-specific integrated circuit (ASIC) chip, an analog chip, a sensor chip, a wireless and radio frequency chip, a voltage regulator chip or a memory chip, for example. In some embodiments, the integrated circuit 100 may be an active component or a passive component. In some embodiments, the integrated circuit 100 includes a semiconductor substrate 102, an interconnect structure 110 and at least one bonding structure 120. In some embodiments, the integrated circuit 100 includes a first region R1 for die bonding and a second region R2 for inductor formation. In other words, the die 200 is bonded to the first region R1 of the integrated circuit 100, and the inductor 300 (as shown in FIG. 1D) is formed in the second region R2. In some embodiments, the second region R2 is aside the first region R1.

In some embodiments, the semiconductor substrate 102 includes an elementary semiconductor such as silicon or germanium and/or a compound semiconductor such as silicon germanium, silicon carbide, gallium arsenic, indium arsenide, gallium nitride or indium phosphide. In some embodiments, the semiconductor substrate 102 is a semiconductor-on-insulator (SOI) substrate. In some alternative embodiments, the semiconductor substrate 102 may take the form of a planar substrate, a substrate with multiple fins, nanowires, or other forms known to people having ordinary skill in the art. Depending on the requirements of design, the semiconductor substrate 102 may be a P-type substrate or an N-type substrate and may have doped regions therein. The doped regions may be configured for an N-type device or a P-type device.

In some embodiments, the semiconductor substrate 102 includes isolation structures defining at least one active area, and a device layer is disposed on/in the active area. The device layer includes a variety of devices 104. In some embodiments, the devices 104 include active components, passive components, or a combination thereof. In some embodiments, the devices 104 may include integrated circuits devices. The devices 104 are, for example, transistors, capacitors, resistors, diodes, photodiodes, fuse devices, or other similar devices. In some embodiments, the device layer includes a gate structure, source/drain regions, spacers, and the like.

The interconnect structure 110 is disposed in the first region R1 over a surface (e.g., front surface) of the semiconductor substrate 102. In some embodiments, the interconnect structure 110 may be also referred to as a top metal. Specifically, the interconnect structure 110 is disposed over and electrically connected to the device 104. In some embodiments, the interconnect structure 110 includes at least one dielectric layer 112 and a plurality of conductive patterns **114*a*1, 114*a*2, 114*b*. The conductive patterns 114*a*1, 114*a*2, 114*b* are disposed in the dielectric layer 112 and electrically connected with each other. In some embodiments, the dielectric layer 112 includes an inter-layer dielectric (ILD) layer on the semiconductor substrate 102, and at least one inter-metal dielectric (IMD) layer over the inter-layer dielectric layer. In some embodiments, the dielectric layer 112 includes silicon oxide, silicon oxynitride, silicon nitride, a low dielectric constant (low-k) material or a combination thereof. The dielectric layer 112 may be a single layer or a multiple-layer structure. In some embodiments, the conductive patterns 114*a*1, 114*a*2 may be conductive lines or conductive layers, and the conductive patterns 114*b* may be conductive vias. The conductive vias are formed between and in contact with two conductive lines or two conductive layers. In addition, the conductive patterns further includes contacts, and the contacts are formed between and in contact with a bottommost conductive pattern such as the conductive pattern 114*a*1 and the device 104. The conductive patterns 114*a*1, 114*a*2, 114*b* may include tungsten (W), copper (Cu), a copper alloy, aluminum (Al), an aluminum alloy or a combination thereof. In some embodiments, a barrier layer may be disposed between the conductive patterns 114*a*1, 114*a*2, 114*b* and the dielectric layer 112 to prevent the material of the conductive patterns 114*a*1, 114*a*2, 114*b* from migrating to the underlying device layer. The barrier layer includes Ta, TaN, Ti, TiN, CoW or a combination thereof, for example. In some embodiments, the interconnect structure 110 is formed by a dual damascene process. In some alternative embodiments, the interconnect structure 110 is formed by multiple single damascene processes. In yet alternative embodiments, the interconnect structure 110 is formed by an electroplating process. It is noted that although the interconnect structure 110 is shown as FIG. 1A, however, the disclosure is not limited thereto, in other words, the interconnect structure 110** may have other suitable configuration.

In some embodiments, a plurality of conductive patterns **116*a*1, 116*a*2, 116*b* are formed aside the interconnect structure 110 in the second region R2. Specifically, the conductive patterns 116*a*1, 116*a*2, 116*b* are formed aside the conductive patterns 114*a*1, 114*a*2, 114*b*. In some embodiments, the conductive patterns 116*a*1, 116*a*2 may be conductive lines or conductive layers, and the conductive patterns 116*b*** may be conductive vias. The conductive vias are formed between and in contact with two conductive lines or two conductive layers.

Herein, when elements are described as "at substantially the same level", the elements are formed at substantially the same height in the same layer. In some embodiments, the surfaces of the elements at substantially the same level are substantially coplanar. In some embodiments, the elements at substantially the same level are formed from the same material(s) with the same process step(s). For example, as shown in FIG. 1A, the conductive patterns **116*a*1, 116*a*2, 116*b* are at substantially the same level with the interconnect structure 110. In detail, the conductive patterns 116*a*1 are at substantially the same level with the conductive pattern 114*a*1, the conductive patterns 116*b* are at substantially the same level with the conductive patterns 114*b*, and the conductive pattern 116*a*2 is at substantially the same level with the conductive pattern 116*a*2. In some embodiments, the conductive pattern 116*a*1 is formed simultaneously with the conductive pattern 114*a*1. Similarly, the conductive patterns 116*b* are formed simultaneously with the conductive patterns 114*b*, and the conductive pattern 116*a*2 is formed simultaneously with the conductive pattern 114*a*2. In some embodiments, the conductive patterns 116*a*1, 116*a*2, 116*b* are disposed in the dielectric layer 112**.

According to the requirements, some of the conductive patterns at the upper level are physically and electrically connected to the conductive patterns at lower level through the conductive patterns therebetween. For example, the outermost conductive pattern **116*a*2 (e.g., the conductive pattern 116*a*2 which is immediately adjacent to the interconnect structure 110) is directly electrically connected to the outermost conductive pattern 116*a*1 (e.g., the conductive pattern 116*a*1 which is immediately adjacent to the interconnect structure 110) through the conductive pattern 116*b* therebetween. In some embodiments, other conductive patterns 116*a*2 may be not electrically connected to the underlying conductive pattern 116*a*1**.

In some embodiments, a conductive pad 118 is formed in the first region R1 over the interconnect structure 110 to electrically connect to the interconnect structure 110. For example, a via 117 is formed on and electrically connected to the topmost conductive pattern **114*a*2 of the interconnect structure 110, and then the conductive pad 118 is formed on and electrically connected to the via 117. The conductive pad 118 may serve as a test pad, for example. In some embodiments, the conductive pad 118** is an aluminum pad. However, the disclosure is not limited thereto.

Then, the bonding structure 120 is formed in the first region R1 over the surface (e.g., front surface) of the interconnect structure 110. In some embodiments, the bonding structure 120 includes at least one bonding dielectric layer 122 and a bonding conductive pattern such as a bonding pad **124*a* and/or a bonding via 124*b*. In some embodiments, the bonding dielectric layer 122 is formed over the dielectric layer 112 to cover the conductive pad 118. The bonding via 124*b* is electrically connected to the interconnect structure 110, and the bonding pad 124*a* is electrically connected to the bonding via 124*b*. In some embodiments, the bonding dielectric layer 122 includes silicon oxide, silicon nitride, a polymer or a combination thereof. The bonding conductive pattern may include tungsten (W), copper (Cu), a copper alloy, aluminum (Al), an aluminum alloy or a combination thereof. In some embodiments, a barrier layer may be disposed between the bonding conductive pattern and the bonding dielectric layer 122. The barrier layer includes Ta, TaN, Ti, TiN, CoW or a combination thereof, for example. In some embodiments, the bonding structure 120 is formed by a dual damascene process. In some alternative embodiments, the bonding structure 120 is formed by multiple single damascene processes. In some alternative embodiments, the bonding structure 120 is formed by an electroplating process. In some embodiments, the bonding structure 120 is physically and electrically connected to the conductive pattern 114*a*2 of the interconnect structure 110. Specifically, the bonding via 124***b* of the bonding structure 120 is in contact with the conductive pattern 114*a*2, and the bonding via 124*b* is disposed between the bonding pad 124*a* and the conductive pattern 114*a*2.

In some embodiments, a plurality of conductive patterns 126*a*, 126*b* are formed in the second region R2 aside the bonding structure 120. Specifically, the conductive patterns 126*a*, 126*b* are formed aside the bonding pad 124*a* and the bonding via 124*b*. In some embodiments, the conductive patterns 126*a*, 126*b* are at substantially the same level with the bonding structure 120. In detail, the conductive pattern 126*a* are at substantially the same level with the bonding pad 124*a*, and the conductive pattern 126*b* are at substantially the same level with the bonding via 124*b*. In some embodiments, the conductive pattern 126*a* may be a conductive pad and formed simultaneously with the bonding pad 124*a*. Similarly, the conductive pattern 126*b* may be a conductive via and formed simultaneously with the bonding via 124*b*. In some embodiments, the conductive patterns 126*a*, 126*b* are disposed in the bonding dielectric layer 122. In some embodiments, a width (e.g., critical dimension) of the conductive patterns 126*a* may be in a range of 2 μm to 4 μm, and a space (e.g., pitch) between the conductive patterns 126*a* may be in a range of 5 μm to 10 μm. In some embodiments, a width (e.g., critical dimension) of the conductive patterns 126*b* may be in a range of 1.5 μm to 2.5 μm.

According to the requirements, some of the conductive patterns 126*a* are physically and electrically connected to the conductive patterns 116*a*2 therebeneath through the conductive patterns 126*b*. For example, the outermost conductive pattern 126*a* (e.g., the conductive pattern 126*a* which is immediately adjacent to the bonding pad 124*a*) is directly electrically connected to the conductive patterns 116*a*2 (e.g., the conductive pattern 116*a*2 which is immediately adjacent to the interconnect structure 110) through the conductive pattern 126*b* therebetween. In some embodiments, at least one conductive pattern 126*a* (e.g., the inner conductive pattern 126*a*) is not physically and electrically connected to the underlying conductive pattern 116*a*2.

In some embodiments, the integrated circuit 100 may further include seal ring. The seal ring is disposed over the surface (e.g., front surface) of the semiconductor substrate 102. Specifically, the seal ring is disposed over and electrically insulated from the device layer, and located aside the interconnect structure 110. In some embodiments, the seal ring may be continuously disposed along a periphery of the integrated circuit 100. For example, the seal ring has a ring shape or any suitable shape from a top view.

Then, a die 200 is bonded to the integrated circuit 100. For example, the die 200 is picked and placed onto the first region R1 of the integrated circuit 100. The die 200 may be an application-specific integrated circuit (ASIC) chip, an analog chip, a sensor chip, a wireless and radio frequency chip, a voltage regulator chip or a memory chip, for example. The die 200 and the integrated circuit 100 may be the same type of dies or different types of dies. In some embodiments, the die 200 may be an active component or a passive component. In some embodiments, the die 200 is smaller than a total area of the integrated circuit 100. In some embodiments, the size of the die 200 is smaller than the size of the integrated circuit 100. Herein, the term "size" is referred to the length, width and/or area. In addition, one die 200 is illustrated, however, there may be more dies over the integrated circuit 100.

In some embodiments, the die 200 includes a semiconductor substrate 202, an interconnect structure 210 and at least one bonding structure 220. In some embodiments, the semiconductor substrate 202 includes isolation structures defining at least one active area, and a device layer is disposed on/in the active area. The device layer includes a variety of devices (not shown). In some embodiments, the devices include active components, passive components, or a combination thereof. In some embodiments, the devices may include integrated circuits devices. The devices are, for example, transistors, capacitors, resistors, diodes, photodiodes, fuse devices, or other similar devices. In some embodiments, the device layer includes a gate structure, source/drain regions, spacers, and the like.

In some embodiments, a through substrate via 206 may be disposed in the semiconductor substrate 202. In some embodiments, the through substrate via 206 is called "a through silicon via" when the semiconductor substrate 202 is a silicon-containing substrate. The through substrate via 206 is electrically connected to the interconnect structure 210 and the to-be-formed redistribution layer structure 250 (as shown in FIG. 1C). In some embodiments, the through substrate via 206 includes a conductive via. The conductive via includes copper, a copper alloy, aluminum, an aluminum alloy or a combination thereof. In some embodiments, the through substrate via 206 further includes a diffusion barrier layer between the conductive via and the semiconductor substrate 202. The diffusion barrier layer includes Ta, TaN, Ti, TiN, CoW or a combination thereof. The through substrate via 206 penetrates the semiconductor substrate 202, in other words, the through substrate via 206 is extended between two opposite surfaces of the semiconductor substrate 202. In some embodiments, a dielectric layer 208 may be further formed over a surface (i.e., the back surface) of the semiconductor substrate 202. The through substrate via 206 is extended into the dielectric layer 208 and exposed through the dielectric layer 208. In some embodiments, a surface of the through substrate via 206 may be substantially coplanar with a surface of the dielectric layer 208, for example.

The interconnect structure 210 is similar to the interconnect structure 110. The interconnect structure 210 is disposed over a surface (e.g., front surface) of the semiconductor substrate 202. Specifically, the interconnect structure 210 is disposed over and electrically connected to the device layer. In some embodiments, the interconnect structure 210 includes at least one dielectric layer 212 and a plurality of conductive patterns 214. The conductive patterns 214 are disposed in the dielectric layer 212 and electrically connected with each other.

The bonding structure 220 is similar to the bonding structure 120. The bonding structure 220 is disposed over the surface (e.g., front surface) of the interconnect structure 210. In some embodiments, the bonding structure 220 is disposed in at least one bonding dielectric layer 222 and includes a bonding conductive pattern such as a bonding pad 224*a* and/or a bonding via 224*b*. The bonding via 224*b* is electrically connected to the interconnect structure 210, and the bonding pad 224*a* is electrically connected to the bonding via 224*b*.

In some embodiments, a conductive pad 218 is formed over the interconnect structure 210 to electrically connect to the interconnect structure 210. For example, a via 217 is formed between the conductive pad 218 and the conductive pattern 214 of the interconnect structure 210 to electrically connect the conductive pad 218 and the interconnect structure 210. In some embodiments, the conductive pad 218 is an aluminum pad, for example. However, the disclosure is not limited thereto. In some embodiments, the conductive pad 218 and the via 217 are disposed in a dielectric layer such as a bonding dielectric layer 222.

In some embodiments, the integrated circuit 100 and the die 200 are face-to-face bonded together with the bonding structures 120 and the bonding structures 220. In some embodiments, before the die 200 is bonded to the integrated circuit 100, the bonding structures 120 and the bonding structures 220 are aligned, such that the bonding pads 124*a* are bonded to the bonding pads 224*a* and the bonding dielectric layer 122 is bonded to the bonding dielectric layer 222. In some embodiments, the alignment of the bonding structure 120 and the bonding structure 220 may be achieved by using an optical sensing method. After the alignment is achieved, the bonding structure 120 and the bonding structure 220 are bonded together by a hybrid bonding including a metal-to-metal bonding and a dielectric-to-dielectric bonding. After the integrated circuit 100 is bonded to the die 200, the integrated circuit 100 is electrically connected to the die 200.

Figure 1B:
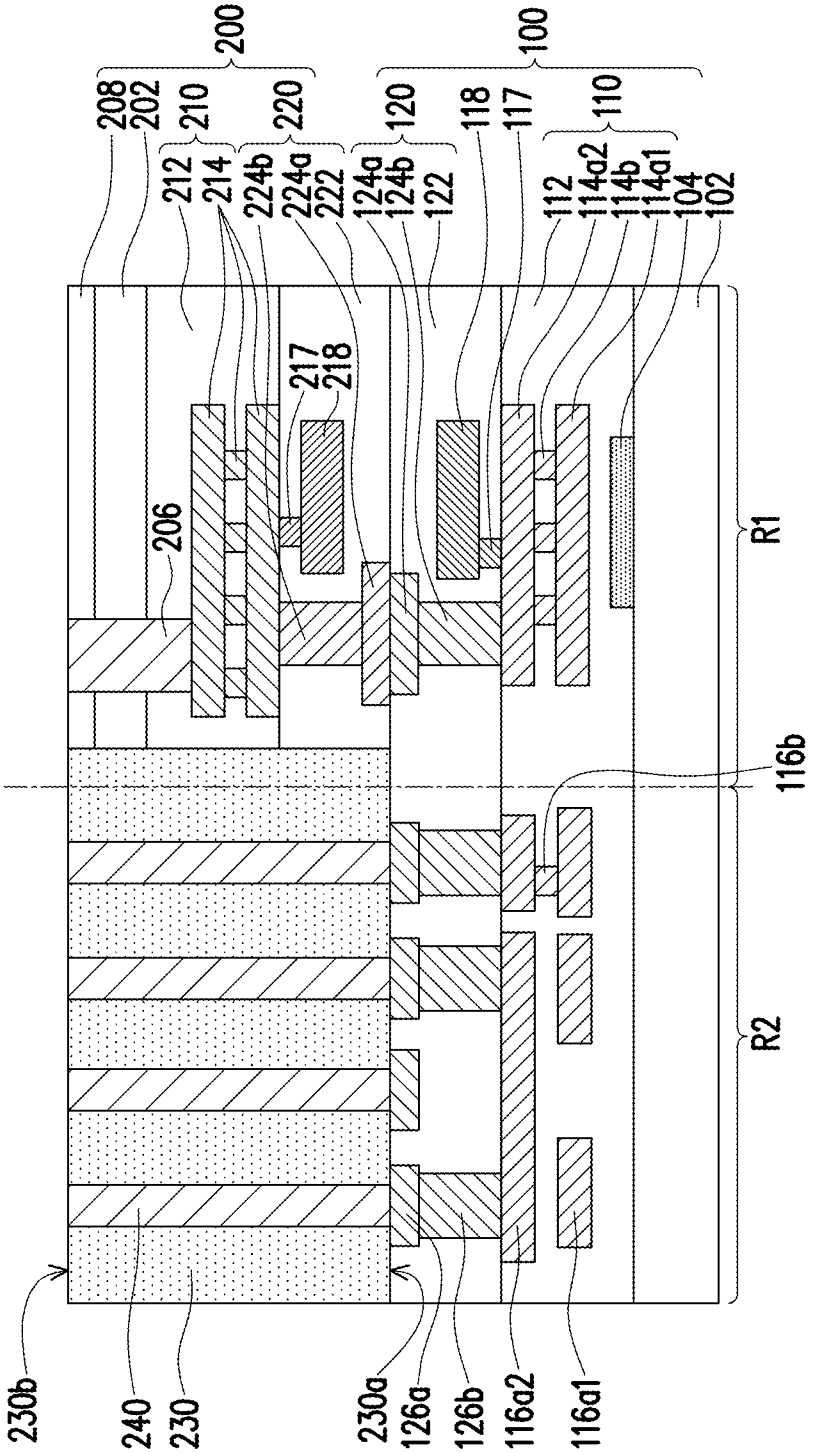
Figure 1C:
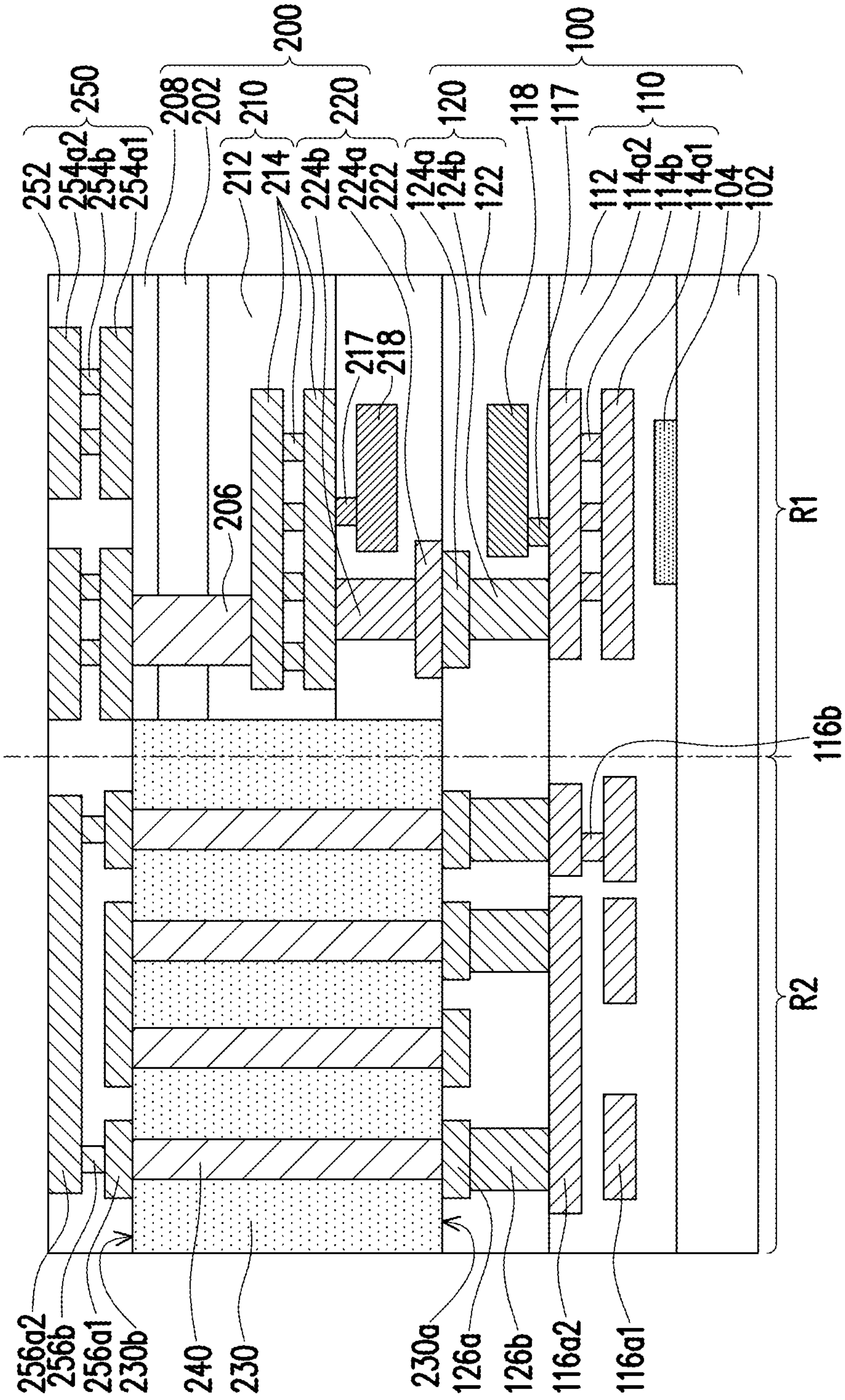

Referring to FIG. 1B, an encapsulant 230 is formed over the integrated circuit 100 to encapsulate the die 200. In some embodiments, the encapsulant 230 fills the gap between the die 200 and other dies (not shown). In some embodiments, the encapsulant 230 includes a molding compound. The molding compound may include a resin and a filler. In some alternative embodiments, the encapsulant 230 includes silicon oxide, silicon nitride or a combination thereof. The encapsulant 230 may be formed by spin-coating, lamination, deposition or the like. The encapsulant 230 surrounds the die 200 and exposes a top of the die 200. In some embodiments, a surface 230*a* of encapsulant 230 overlays the surface (e.g., front surface) of the integrated circuit 100, and a surface 230*b* of the encapsulant 230 opposite to the surface 230*a* is substantially coplanar with the surface (e.g., back surfaces) of the die 200. For example, after forming the encapsulant 230, a planarization process is performed to remove a portion of the dielectric layer 208, and thus the through substrate via 206 is revealed. In some embodiments, the surfaces of the dielectric layer 208 and the through substrate via 206 are substantially coplanar with the surface 230*b* of the encapsulant 230.

Figure 3:
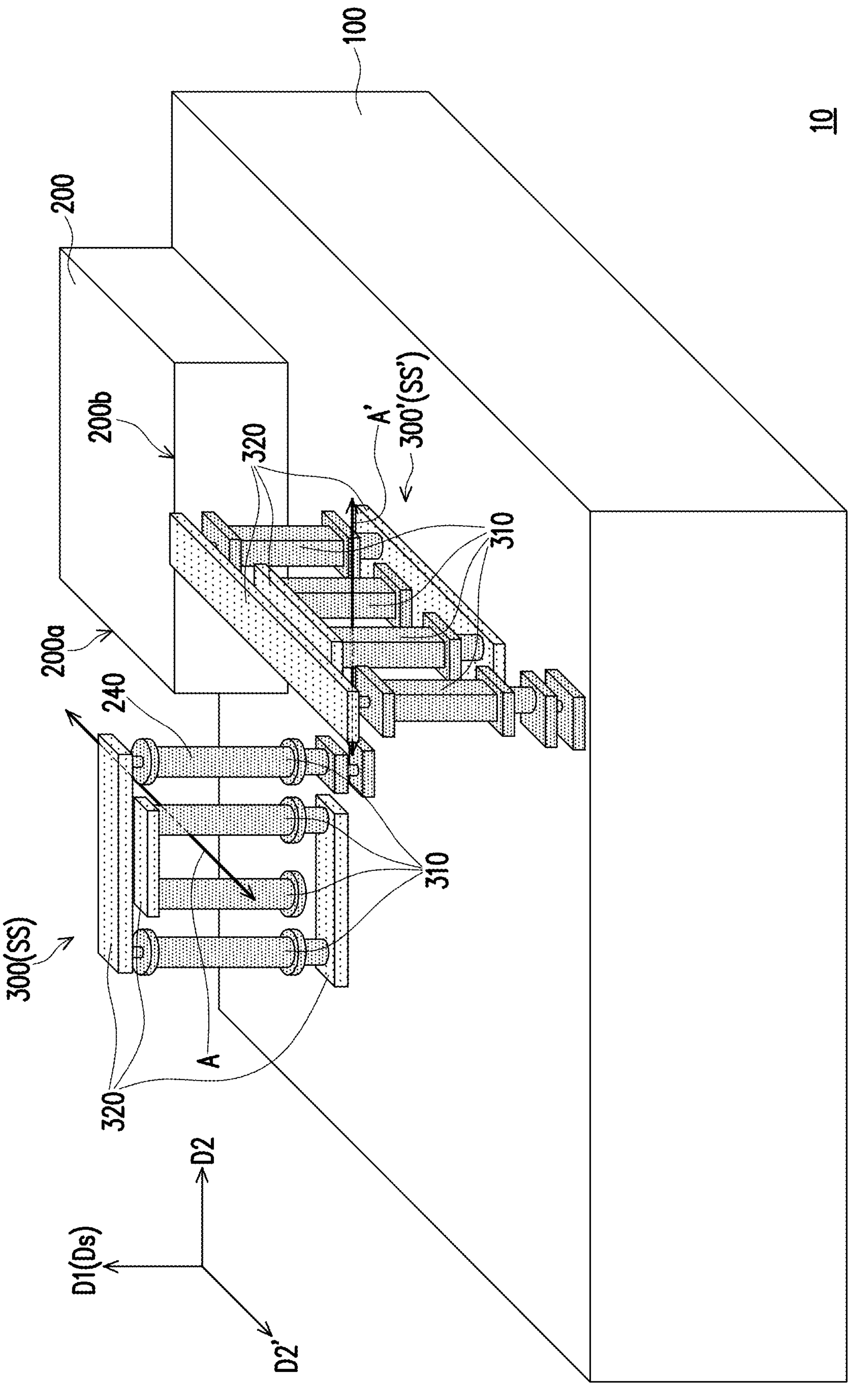
FIG. 3 is a three-dimensional view of a semiconductor package in accordance with some embodiments.

Then, a plurality of through dielectric vias 240 are formed in the encapsulant 230. In some embodiments, the through dielectric vias 240 are formed in the second region R2. The through dielectric vias 240 are electrically connected to the conductive patterns 126*a* directly therebeneath. A width (e.g., critical dimension) of the through dielectric vias 240 may be in a range of 3 μm to 5 μm, and a space between the through dielectric vias 240 may be in a range of 3 μm to 5 μm. The through dielectric vias 240 include copper, a copper alloy, aluminum, an aluminum alloy or a combination thereof. In some alternative embodiments, the through dielectric via 240 includes a conductive pillar and a diffusion barrier layer between the conductive pillar and the encapsulant 230. The diffusion barrier layer includes Ta, TaN, Ti, TiN, CoW or a combination thereof. In some alternative embodiments, there are some other through dielectric vias (not shown) in the first region R1 to electrically connect with the interconnect structure 110 and the to-be-formed redistribution layer structure. In some embodiments, the through dielectric via 240 may be cuboid pillars (as shown in FIG. 2), cylindrical pillars (as shown in FIG. 3) or pillars having other suitable profiles.

Referring to FIG. 1C, a redistribution layer structure 250 is formed over the die 200 and the encapsulant 230 over the integrated circuit 100. In some embodiments, the redistribution layer structure 250 may be also referred to as a backside redistribution layer or a backside metal. The redistribution layer structure 250 is formed in the first region R1, for example. In some embodiments, a portion of the redistribution layer structure 250 is electrically connected to the through silicon vias 206. In some embodiments, another portion of the redistribution layer structure 250 may be electrically connected to the through dielectric vias (not shown) in the encapsulant 230 in the first region R1, to electrically connect the integrated circuit 100. The redistribution layer structure 250 includes at least one dielectric layer 252 and a plurality of conductive pattern 254*a*1, 254*b*, 254*a*2. The conductive patterns 254*a*1, 254*a*2, 254*b* are disposed in the dielectric layer 252 and electrically connected with each other. In some embodiments, the conductive patterns 254*a*1, 254*a*2 may be conductive lines or conductive layers, and the conductive patterns 254*b* may be conductive vias. The conductive vias are formed between and in contact with two conductive lines or two conductive layers. The conductive patterns 254*a*1, 254*a*2, 254*b* may include tungsten (W), copper (Cu), a copper alloy, aluminum (Al), an aluminum alloy or a combination thereof. In some embodiments, the conductive patterns 254*a*1, 254*a*2 may be also referred to as backside metals. In some embodiments, a barrier layer may be disposed between the conductive patterns 254*a*1, 254*a*2, 254*b* and the dielectric layer 252 to prevent the material of the conductive patterns 254*a*1, 254*a*2, 254*b* from migrating to the underlying device layer. The barrier layer includes Ta, TaN, Ti, TiN, CoW or a combination thereof, for example. In some embodiments, the redistribution layer structure 250 is formed by a dual damascene process. In some alternative embodiments, the redistribution layer structure 250 is formed by multiple single damascene processes. In yet alternative embodiments, the redistribution layer structure 250 is formed by an electroplating process. In some embodiments, the dielectric layer 252 includes a photo-sensitive material such as polybenzoxazole (PBO), polyimide (PI), benzocyclobutene (BCB), a combination thereof or the like. It is noted that although the redistribution layer structure 250 is shown as FIG. 1C, however, the disclosure is not limited thereto, in other words, the redistribution layer structure 250 may have other suitable configuration.

In some embodiments, a plurality of conductive patterns 256*a*1, 256*a*2, 256*b* are formed aside the redistribution layer structure 250 in the second region R2. Specifically, the conductive patterns 256*a*1, 256*a*2, 256*b* are formed aside the conductive patterns 254*a*1, 254*a*2, 254*b*. In some embodiments, the conductive patterns 256*a*1, 256*a*2 may be conductive lines or conductive layers, and the conductive patterns 256*b* may be conductive vias. The conductive vias are formed between and in contact with two conductive lines or two conductive layers.

In some embodiments, as shown in FIG. 1C, the conductive patterns 256*a*1, 256*a*2, 256*b* are at substantially the same level with the redistribution layer structure 250. In detail, the conductive patterns **256*a*1 are at substantially the same level with the conductive pattern 254*a*1, the conductive patterns 256*b* are at substantially the same level with the conductive patterns 254*b*, and the conductive pattern 256*a*2 is at substantially the same level with the conductive pattern 254*a*2. In some embodiments, the conductive pattern 256*a*1 is formed simultaneously with the conductive pattern 254*a*1. Similarly, the conductive patterns 256*b* are formed simultaneously with the conductive patterns 254*b*, and the conductive pattern 256*a*2 is formed simultaneously with the conductive pattern 254*a*2. In some embodiments, the conductive patterns 256*a*1, 256*a*2, 256*b* are disposed in the dielectric layer 252. In some embodiments, a width (e.g., critical dimension) of the conductive patterns 256*a*1, 256*a*2 may be in a range of 0.3 μm to 12 μm, and a space between the conductive patterns 256*a*1, 256*a*2 may be larger than 0.3 μm. A thickness of the conductive patterns 256*a*1, 256*a*2 may be in a range of 0.3 μm to 1.5 μm, for example. In some embodiments, a width (e.g., critical dimension) of the conductive patterns 256*b* may be in a range of 0.3 μm to 0.5 μm, and a thickness of the conductive patterns 256*b*** may be in a range of 0.3 μm to 1 μm.

According to the requirements, some of the conductive patterns at the upper level are physically and electrically connected to the conductive patterns at lower level through the conductive patterns therebetween. For example, the conductive pattern **256*a*2 (e.g., the conductive pattern 256*a*2 which is immediately adjacent to the redistribution layer structure 250) is directly electrically connected to the outermost conductive pattern 256*a*1 (e.g., the conductive pattern 256*a*1 which is immediately adjacent to the redistribution layer structure 250) through the conductive pattern 256*b* therebetween. In some embodiments, other conductive patterns 256*a*2 are not physically and electrically connected to the underlying conductive pattern 256*a*1**.

Referring to FIG. 1D, a conductive pad 260 is disposed over the redistribution layer structure 250 to electrically connect to the redistribution layer structure 250. In some embodiments, the conductive pad 260 is formed in the first region R1. In addition, a via 258 may be formed in a dielectric layer 257 between the conductive pad 260 and the topmost conductive pattern **256*a*2 of the redistribution layer structure 250 to electrically connect the conductive pad 260 and the redistribution layer structure 250. The conductive pads 260 include a metal or a metal alloy. The conductive pads 260 includes aluminum, copper, nickel, or an alloy thereof. For example, the conductive pads 260** is an aluminum pad. However, the disclosure is not limited thereto.

Then, a passivation layer 262 covers the dielectric layer 252 and an edge portion of the conductive pad 260, and exposes the center portions of the conductive pad 260. In some embodiments, the passivation layer 262 includes silicon oxide, silicon nitride, benzocyclobutene (BCB) polymer, polyimide (PI), polybenzoxazole (PBO) or a combination thereof.

After that, an under-bump metallurgy (UBM) layer 264 is formed to electrically connect to the conductive pad 260. In some embodiments, the UBM layer 264 is extended into the passivation layer 262. The UBM layer 264 may include a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Then, a conductive connector 266 is mounted to the conductive pad 262. In some embodiments, the conductive connector 266 may be one of ball grid array (BGA) connectors, solder balls, metal pillars, and/or the like. The conductive connector 266 may be formed by a mounting process and a reflow process, for example. Then, a semiconductor package 10 is formed. In some embodiments, the semiconductor package 10 is a system on integrated circuit (SoIC), for example. However, the disclosure is not limited thereto.

FIGS. 1A to 1D also illustrate the formation of an inductor 300. In some embodiments, the inductor 300 includes the conductive patterns **116*a*1, 116*a*2, 116*b*, the conductive patterns 126*a*, 126*b*, the through dielectric vias 240 and the conductive patterns 256*a*1, 256*a*2, 256*b* formed in the region R2. By physically connected to one another, the conductive patterns 116*a*1, 116*a*2, 116*b*, the conductive patterns 126*a*, 126*b*, the through dielectric vias 240 and the conductive patterns 256*a*1, 256*a*2, 256*b* form a spiral structure SS, as shown in FIGS. 1D and 2. In some embodiments, the conductive patterns 116*a*1, 116*a*2, 116*b* are formed simultaneously with the conductive patterns 114*a*1, 114*a*2, 114*b* of the interconnect structure 110. The conductive patterns 126*a*, 126*b* are formed simultaneously with the bonding pad 124*a* and the bonding via 124*b* of the bonding structure 120, for example. The conductive patterns 256*a*1, 256*a*2, 256*b* are formed simultaneously with the conductive patterns 254*a*1, 254*a*2, 254*b* of the redistribution layer structure 250, for example. In some alternative embodiments, the through dielectric vias 240 are formed simultaneously with through dielectric vias (not shown) penetrating the encapsulant 230 and connecting the integrated circuit 100 and the redistribution layer structure 250**.

In some embodiments, as shown in FIG. 2, the inductor 300 includes a plurality of first conductive patterns 310 (represented by dark hatching) such as vertical conductive patterns and a plurality of second conductive patterns 320 (represented by light hatching) such as horizontal conductive patterns. In some embodiments, the first conductive patterns 310 penetrate the encapsulant 230 between the opposite surfaces **230*a*, 230*b*, and the second conductive patterns 320 are disposed over opposite surfaces 230*a*, 230*b* of the encapsulant 230. The first conductive pattern 310 is extended along a first direction D1 (e.g., z direction), and the first conductive pattern 310 may be formed by one of the through dielectric vias 240 and respective one or ones of the conductive patterns 116*a*1, 116*a*2, 116*b*, 126*a*, 126*b*, 256*a*1, 256*b* physically connected to the one of the through dielectric vias 240. In some embodiments, the conductive patterns 116*a*1, 116*a*2, 116*b*, 126*a*, 126*b*, 256*a*1, 256*b* are also referred to as vertical portions. For example, as shown in FIG. 2, one of the first conductive patterns 310 is formed by the through dielectric via 240, the conductive patterns 126*a*, 126*b*, 116*a*2 therebeneath and the conductive patterns 256*a*1, 256*b*** thereover.

The second conductive pattern 320 is extended along a second direction D2 substantially perpendicular to the first direction D1, and the second conductive pattern 320 may be selected from the conductive patterns **116*a*1, 116*a*2, 256*a*1, 256*a*2. In some embodiments, the second direction D2 is a horizontal direction (e.g., x direction), and the conductive patterns 116*a*2, 256*a*1, 256*a*2 are also referred to as horizontal portions. For example, one of the second conductive patterns 320 is formed by the conductive pattern 256*a*2, and another one of the second conductive patterns 320 is formed by the conductive pattern 256*a*1. In some embodiments, by forming a plurality of conductive patterns at different levels (e.g., height, layer), the inductor 300 is vertically formed over the substrate 102, and thus the inductor 300** is also referred to as a vertical inductor.

In some embodiments, the conductive pattern 126*a* and the conductive pattern 116*a*1 are served as two ends 302*a*, 302*b* of the spiral structure SS. In some embodiments, the spiral structure SS has at least two coils between the two ends 302*a*, 302*b*. However, the disclosure is not limited thereto. In some alternative embodiments, by forming more conductive levels (e.g., layers) over and/or under the encapsulant 230, the inductor 300 may be formed with more coils. In some alternative embodiments, the ends 302*a*, 302*b* of the spiral structure SS may be formed by other conductive patterns, and the spiral structure SS may be constituted by any other number of coil/coils. The coils are formed around an axis A, and the axis A is substantially perpendicular to a stacking direction Ds (e.g., z direction) of the die 200 and the integrated circuit 100. In some embodiments, the axis A is substantially parallel to y direction. The direction of the axis A is also referred to as an induction direction of the inductor 300. In some embodiments, the induction direction of the inductor is single direction. As shown in FIG. 2, when the first conductive patterns 310 are disposed at the same side (i.e., right side or left side) of the axis A, a length of the first conductive pattern 310 decreases as the first conductive pattern 310 becomes closer to the axis A. For example, the first conductive pattern 310A and the first conductive pattern 310B are disposed at the right side of the axis A, a length of the first conductive pattern 310A is shorter than the first conductive pattern 310B. Similarly, as shown in FIG. 2, when the second conductive patterns 320 are disposed at the same side (i.e., top side or bottom side) of the axis A, a length of the second conductive pattern 320 decreases as the second conductive pattern 320 becomes closer to the axis A. For example, the second conductive pattern 320A and the second conductive pattern 320B are disposed at the top side of the axis A, a length of the second conductive pattern 320A is shorter than the second conductive pattern 320B.

Figure 4:
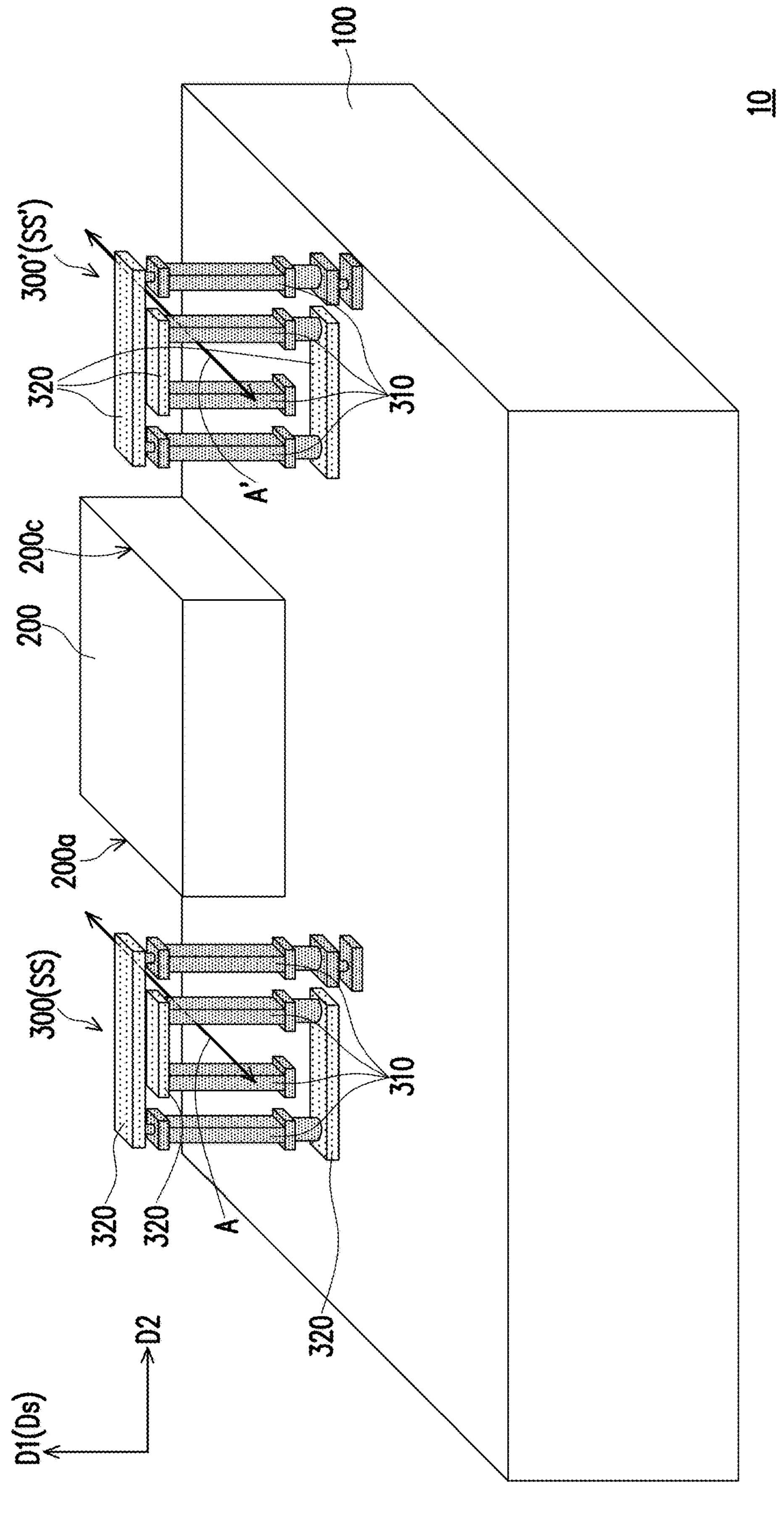
FIG. 4 is a three-dimensional view of a semiconductor package in accordance with some embodiments.

In some embodiments, one inductor 300 is formed in the semiconductor package 10. However, the disclosure is not limited thereto. In some alternative embodiments, as shown in FIG. 3, at least two inductors 300, 300' are formed in the semiconductor package 10. The configuration and formation of the inductor 300, 300' may be similar to the inductor 300 of FIG. 2, and thus the details are omitted herein. In some embodiments, the inductor 300 includes cylindrical pillars, and the inductor 300' includes cuboid pillars. However, the disclosure is not limited thereto. In some embodiments, the inductors 300, 300' are disposed at different sides of the die 200. For example, the inductor 300 is disposed at a first side 200*a* of the die 200, and the inductor 300' is disposed at a second side 200*b* immediately adjacent to the first side 200*a* of the die 200. However, the disclosure is not limited thereto. In some alternative embodiments, as shown in FIG. 4, the inductors 300, 300' may be disposed at opposite sides 200*a*, 200*c* (e.g., sides substantially parallel to each other) of the die 200. In this embodiment, the axis A' of the inductor 300' is substantially parallel to the axis A of the inductor 300. Further, in some alternative embodiments, more inductors (e.g., three or more) may be formed in the encapsulant 230 aside the die 200 as long as they are not interfered with one another.

Referring to FIG. 3, the inductor 300 has a spiral structure SS, and the spiral structure SS has a plurality of coils around an axis A. The axis A is substantially perpendicular to a stacking direction Ds of the die 200 and the integrated circuit 100. Similarly, the inductor 300' has a spiral structure SS', and the spiral structure SS' has a plurality of coils around an axis A'. The axis A' is substantially perpendicular to the stacking direction Ds of the die 200 and the integrated circuit 100. In some embodiments, the axis A' is different from the axis A, and the axis A' is substantially perpendicular to the axis A. In some embodiments, the axis A is along the second direction D2' such as y direction, and the axis A' is along a second direction D2 such as x direction. That is, the stacking direction Ds is z direction, the axis A is substantially parallel to y direction, and the axis A' is substantially parallel to x direction. In such embodiments, the vertical inductors 300, 300' have two induction directions which are not interfered with each other. In some alternative embodiments, more vertical inductors may be formed in the semiconductor package as long as the induction directions of the vertical inductors are not interfered with one another.

Figure 5:
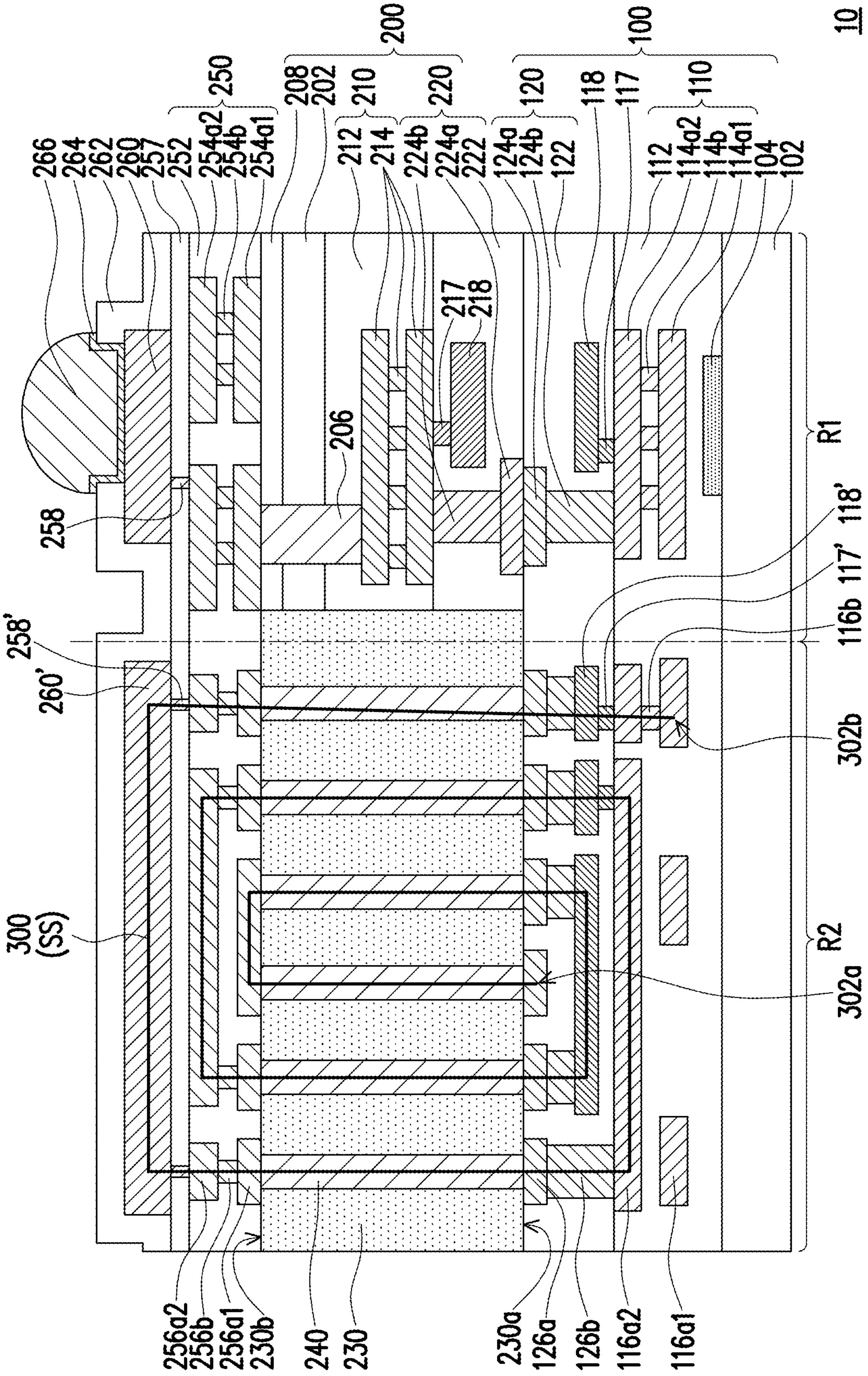
FIG. 5 illustrates a cross-sectional view of a semiconductor package in accordance with some embodiments.
Figure 6:
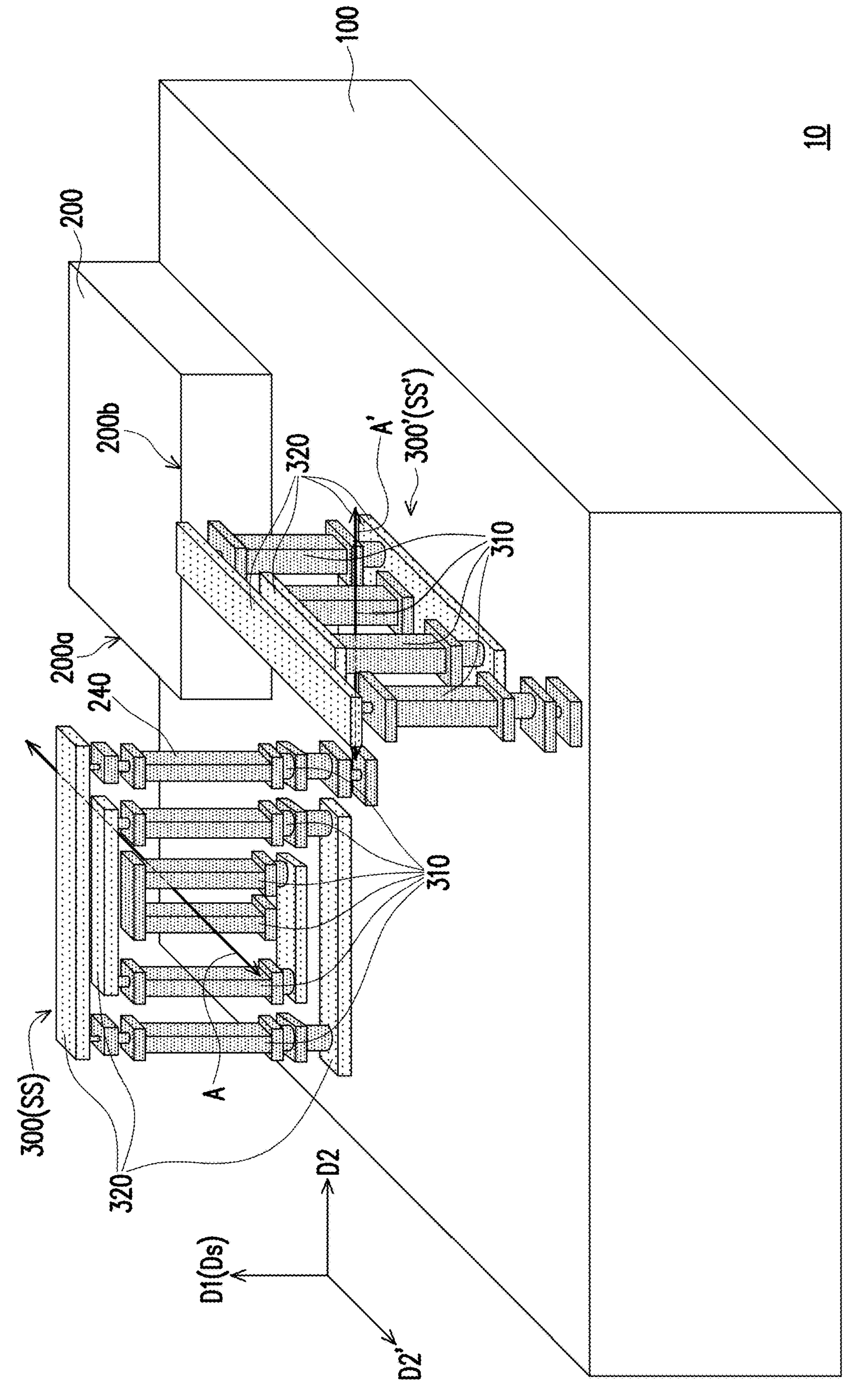
FIG. 6 is a three-dimensional view of the semiconductor package of FIG. 5.

FIG. 5 illustrates a cross-sectional view of a semiconductor package in accordance with some embodiments, and FIG. 6 is a three-dimensional view of the semiconductor package of FIG. 5. The semiconductor package 10 of FIG. 5 is similar to the semiconductor package 10 of FIG. 1D, and the main difference is described below. Referring to FIGS. 5 and 6, in some embodiments, the inductor 300 includes conductive patterns 116*a*1, 116*a*2, 116*b*, 126*a*, 126*b*, 256*a*1, 256*a*2, 256*b*, through dielectric vias 240 and conductive patterns 117', 118', 258', 260' formed in the region R2. The conductive patterns 116*a*1, 116*a*2, 116*b*, 126*a*, 126*b*, 256*a*1, 256*a*2, 256*b* and the through dielectric vias 240 are similar to those of FIG. 1D, and thus details are omitted herein. In some embodiments, the conductive patterns 117', 118' are further formed between the conductive pattern 126*b* and the conductive pattern 116*a*2. For example, the conductive pattern 117' is at substantially the same level with the via 117, and the conductive pattern 118' are at substantially the same level with the conductive pad 118. Further, the conductive pattern 258' is additionally formed and at substantially the same level with the via 258, and the conductive pattern 260' is additionally formed and at substantially the same level with the conductive pad 260. In some embodiments, the conductive pattern 117' is formed simultaneously with the via 117, the conductive pattern 118' is formed simultaneously with the conductive pad 118, the conductive pattern 258' is formed simultaneously with the via 258, and the conductive pattern 260' is formed simultaneously with the conductive pad 260. However, the disclosure is not limited thereto.

Figure 7:
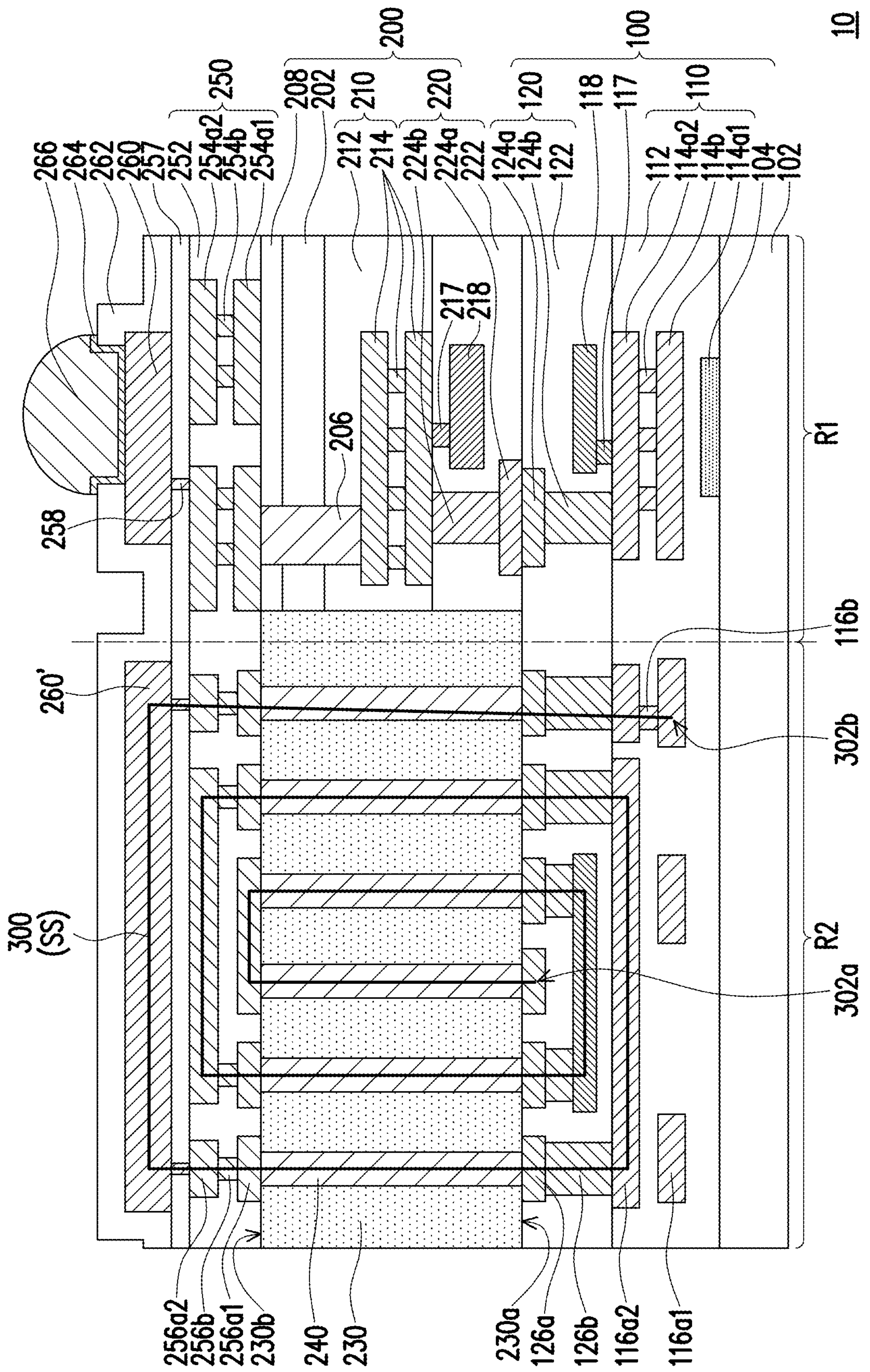
FIG. 7 illustrates a cross-sectional view of a semiconductor package in accordance with some embodiments.

In some embodiments, the conductive patterns 126*a* have different height. For example, a height of the conductive patterns 126*b* between the conductive pattern 126*a* and the conductive pattern 118' is smaller than a height of the conductive patterns 126*b* between the conductive pattern 126*a* and the conductive pattern 116*a*2. In some embodiments, some of the conductive patterns 126*b* (e.g., the conductive pattern 126*b* immediately adjacent to the bonding structure 120) are electrically connected to the conductive pattern 116*a*2 through the conductive patterns 118', 117' therebetween. However, the disclosure is not limited thereto. In some alternative embodiments, as shown in FIG. 7, the conductive patterns 126*b* (e.g., the conductive pattern 126*b* immediately adjacent to the bonding structure 120) may be directly landed onto the conductive pattern 116*a*2 without other conductive patterns therebetween.

In some embodiments, the conductive pattern 126*a* and the conductive pattern 116*a*1 serve as two ends 302*a*, 302*b* of the spiral structure SS. In some embodiments, the spiral structure SS has at least three coils between the two ends 302*a*, 302*b*. However, the disclosure is not limited thereto. In some embodiments, as shown in FIG. 6, at least two inductors 300, 300' are formed in the semiconductor package 10. The arrangement of the inductors 300, 300' are similar to the arrangement of the inductors 300, 300' in FIG. 3, and thus details are omitted herein.

In some embodiments, the vertical inductor is formed by the dielectric through vias in the encapsulant and the conductive patterns connecting the dielectric through vias over and below the encapsulant. The conductive patterns may be formed simultaneously with or served as the redistribution layer structure, the through dielectric via, the bonding structure and/or the interconnect structure. Accordingly, in some embodiments, additional process is not required, and thus the cost of the inductor may be reduced. Furthermore, compared to the horizontally disposed inductor, in some embodiments, by disposing the inductor vertically, the interference caused from other conductive patterns may be avoided, and thus the yield and/or the performance of the inductor may be improved.

According to some embodiments, a semiconductor package includes an integrated circuit, a die, an encapsulant and an inductor. The die is bonded to the integrated circuit. The encapsulant encapsulates the die over the integrated circuit. The inductor includes a plurality of first conductive patterns and a plurality of second conductive patterns. The first conductive patterns penetrate through the encapsulant. The second conductive patterns are disposed over opposite surfaces of the encapsulant. The first conductive patterns and the second conductive patterns are electrically connected to one another to form a spiral structure having two ends.

According to some embodiments, a semiconductor package includes an integrated circuit, a die, an encapsulant, a plurality of through vias, a plurality of second conductive layers and a plurality of second conductive vias. The integrated circuit includes a plurality of first conductive layers and a plurality of first conductive vias. The die is bonded to the integrated circuit. The encapsulant encapsulates the die over the integrated circuit. The through vias are disposed in the encapsulant. The second conductive layers and the second conductive vias are disposed over the encapsulant. The through vias, the first conductive layers, the first conductive vias, the second conductive layers and the second conductive vias are connected to form an inductor having a spiral structure.

According to some embodiments, a semiconductor package includes an integrated circuit, a die, an encapsulant and a first inductor. The die is stacked on the integrated circuit along a first direction. The encapsulant encapsulates the die over the integrated circuit. The first inductor is disposed in the encapsulant and having a first spiral structure. The first spiral structure has a plurality of first coils around a first axis, and the first axis is substantially perpendicular to the first direction.

According to some embodiments, a semiconductor package includes a first die, a second die, an encapsulant, a first inductor and a second inductor. The second die is stacked on the first die along a first direction. The encapsulant encapsulates the second die over the first die. The first inductor is disposed in the encapsulant and has a first spiral structure, wherein the first spiral structure has a plurality of first coils around a first axis, and the first axis is substantially perpendicular to the first direction. The second inductor is disposed in the encapsulant and having a second spiral structure, wherein the first inductor and the second inductor are disposed at opposite sides of the second die.

According to some embodiments, a semiconductor package includes a first die, a second die, an encapsulant, a first inductor and a second inductor. The second die is bonded to the first die along a first direction. The encapsulant encapsulates the second die over the first die. The first inductor has a first spiral structure, and the first spiral structure including a plurality of first conductive patterns penetrating through the encapsulant along the first direction. The second inductor is disposed in the encapsulant and has a second spiral structure, wherein the first inductor and the second inductor are disposed at opposite sides of the second die along a second direction substantially perpendicular to the first direction.

According to some embodiments, a semiconductor package includes a first die, a second die, an encapsulant, through vias, a first inductor and a second inductor. The first die includes a first bonding pad and a first bonding dielectric layer, a plurality of first conductive layers and a plurality of first conductive vias. The second die includes a second bonding pad bonded to the first bonding pad and a second bonding dielectric layer bonded to the first bonding layer. The encapsulant encapsulates the second die over the first die. The through vias are disposed in the encapsulant. The through vias, the first conductive layers, the first conductive via and a plurality of second conductive layers and a plurality of second conductive vias over the encapsulant are connected to form the first inductor having a first spiral structure. The second inductor is disposed in the encapsulant and having a second spiral structure, wherein the first inductor and the second inductor are disposed at opposite sides of the second die.

According to some embodiments, a method of forming a semiconductor package includes the following steps. A first die is provided, wherein the first die comprises a plurality of first conductive patterns. A plurality of second conductive patterns are formed over the first die, wherein the second conductive patterns are connected to the first conductive patterns to form a first coil and a second coil surrounding the first coil.

According to some embodiments, a method of forming a semiconductor package includes the following steps. A plurality of first conductive layers and a plurality of first conductive vias alternately stacked are formed. A plurality of through vias over the first conductive layers and the first conductive vias are formed. A plurality of second conductive layers and a plurality of second conductive vias over the through vias are formed. The through vias, the first conductive layers, the first conductive vias, the second conductive layers and the second conductive vias are connected to form an inductor having a first coil and a second coil surrounding the first coil.

According to some embodiments, a method of forming a semiconductor package includes the following steps. A first die is provided. A second die is stacked on the first die along a first direction. A first inductor is formed over the first die, the first inductor includes a plurality of first coils around a first axis, and the first axis is substantially perpendicular to the first direction. A second inductor is formed over the first die, wherein the second inductor includes a plurality of second coils around a second axis.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor package, comprising:
   forming a plurality of first conductive patterns over a semiconductor substrate along a first direction; and
   forming a plurality of second conductive patterns stacked over the first conductive patterns along the first direction, wherein the second conductive patterns are connected to the first conductive patterns to form a first coil and a second coil surrounding the first coill, the first coil has a first total height extended along the first direction, the second coil has a second total height along the first direction, and the second total height is different from the first total height.

2. The method as claimed in claim 1, further comprising a device under the first conductive patterns.

3. The method as claimed in claim 1, wherein forming the second conductive patterns comprises:
   forming through vias; and
   forming first horizontally extended conductive features and first vertically extended conductive features electrically connected to the through vias.

4. The method as claimed in claim 3, further comprising forming an encapsulant to encapsulate the through vias before forming the first horizontally extended conductive features and the first vertically extended conductive features.

5. The method as claimed in claim 3, further comprising:
   placing a die aside the second conductive patterns; and
   forming second horizontally extended conductive features and second vertically extended conductive features electrically connected to the die.

6. The method as claimed in claim 5, wherein the second horizontally extended conductive features and second vertically extended conductive features are formed simultaneously with the first horizontally extended conductive features and first vertically extended conductive features.

7. The method as claimed in claim 5, further comprising:
   forming a passivation layer over the first and second horizontally extended conductive features;
   forming an under-bump metallurgy (UBM) layer in the passivation layer; and
   forming a conductive connector on the UBM layer.

8. A method of forming a semiconductor package, comprising:
   forming a plurality of first conductive layers and a plurality of first conductive vias alternately stacked along a first direction;
   forming a plurality of through vias over the first conductive layers and the first conductive vias; and
   forming a plurality of second conductive layers and a plurality of second conductive vias over the through vias,
   wherein the through vias, the first conductive layers, the first conductive vias, the second conductive layers and the second conductive vias are connected to form an inductor having a first coil and a second coil surrounding the first coil, and the first coil and the second coil are around an axis substantially perpendicular to the first direction.

9. The method as claimed in claim 8, further comprising forming a first dielectric layer to encapsulate the first conductive layers and the first conductive vias.

10. The method as claimed in claim 9, further comprising forming a first bonding pad and a first bonding via aside the first conductive layers and the first conductive vias, wherein the first dielectric layer further encapsulates the first bonding pad and the first bonding via.

11. The method as claimed in claim 10, further comprising forming a conductive pad aside the first bonding via, wherein the first dielectric layer further encapsulates the conductive pad.

12. The method as claimed in claim 10, wherein some of the first conductive layers are formed simultaneously with the first bonding pad and some of the first conductive vias are formed simultaneously with the first bonding via.

13. The method as claimed in claim 10, further comprising bonding a second bonding pad of a die onto the first bonding pad.

14. The method as claimed in claim 13, further comprising forming an encapsulant to encapsulate the die and the through vias.

15. The method as claimed in claim 13, wherein the second conductive layers and the second conductive vias are formed over the encapsulant.

16. A method of forming a semiconductor package, comprising:
   providing a first die;
   stacking a second die on the first die along a first direction;
   forming a first inductor over the first die, the first inductor comprising a plurality of first coils around a first axis, wherein the first axis is substantially perpendicular to the first direction, and one of the first coils surrounds another one of the first coils; and
   forming a second inductor over the first die, wherein the second inductor includes a plurality of second coils around a second axis, wherein the first inductor and the second inductor are physically separated.

17. The method as claimed in claim 16, wherein the second axis is substantially perpendicular to the first direction.

18. The method as claimed in claim 16, wherein the first inductor and the second inductor are disposed at different sides of the second die.

19. The method as claimed in claim 16, wherein the first inductor and the second inductor are disposed at opposite sides of the second die.

20. The method as claimed in claim 16, wherein the second axis is different from the first axis.

* * * * *